United States Patent
Spring

(10) Patent No.: US 7,217,976 B2
(45) Date of Patent: May 15, 2007

(54) LOW TEMPERATURE PROCESS AND STRUCTURES FOR POLYCIDE POWER MOSFET WITH ULTRA-SHALLOW SOURCE

(75) Inventor: Kyle Spring, Temecula, CA (US)

(73) Assignee: International Rectifier Corporation, El Segundo, CA (US)

( * ) Notice: Subject to any disclaimer, the term of this patent is extended or adjusted under 35 U.S.C. 154(b) by 164 days.

(21) Appl. No.: 11/053,617

(22) Filed: Feb. 8, 2005

(65) Prior Publication Data

US 2005/0173760 A1    Aug. 11, 2005

Related U.S. Application Data

(60) Provisional application No. 60/543,440, filed on Feb. 9, 2004.

(51) Int. Cl.
| | |
|---|---|
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |

(52) U.S. Cl. .............. 257/341; 257/328; 257/329; 257/330; 257/331; 257/332; 257/333; 257/334; 257/342; 257/401

(58) Field of Classification Search ........ 257/324–334, 257/341–342, 401
See application file for complete search history.

(56) References Cited

U.S. PATENT DOCUMENTS

| | | | | |
|---|---|---|---|---|
| 5,371,024 | A * | 12/1994 | Hieda et al. ............... | 438/291 |
| 5,576,567 | A * | 11/1996 | Mori ......................... | 257/316 |
| 6,262,453 | B1 * | 7/2001 | Hshieh ....................... | 257/341 |
| 6,323,518 | B1 * | 11/2001 | Sakamoto et al. .......... | 257/330 |
| 6,352,897 | B1 * | 3/2002 | Sung .......................... | 438/296 |
| 6,373,097 | B1 * | 4/2002 | Werner ....................... | 257/329 |
| 6,538,280 | B2 | 3/2003 | Nakamura .................. | 257/333 |
| 6,555,872 | B1 * | 4/2003 | Dennen ...................... | 257/327 |
| 6,569,737 | B2 * | 5/2003 | Park et al. .................. | 438/270 |
| 6,664,592 | B2 * | 12/2003 | Inumiya et al. ............ | 257/330 |
| 7,052,963 | B2 * | 5/2006 | Williams et al. ........... | 438/268 |
| 2001/0030350 | A1 * | 10/2001 | Oowaki et al. ............. | 257/410 |
| 2005/0079676 | A1 * | 4/2005 | Mo et al. .................... | 438/268 |

* cited by examiner

*Primary Examiner*—Ida M. Soward
(74) *Attorney, Agent, or Firm*—Ostrolenk, Faber, Gerb & Soffen, LLP

(57) ABSTRACT

A trench type power semiconductor device includes proud gate electrodes that extend out of the trenches and above the surface of the semiconductor body. These proud gate electrodes allow for making ultra-shallow source regions within the semiconductor body using, for example, a low temperature source drive. In addition, a method for manufacturing the trench type power semiconductor device includes a low temperature process flow once the gate electrodes are formed.

8 Claims, 3 Drawing Sheets

LOW TEMPERATURE PROCESS AND STRUCTURES FOR POLYCIDE POWER MOSFET WITH ULTRA-SHALLOW SOURCE

RELATED APPLICATIONS

This application is based on and claims priority to U.S. Provisional Application No. 60/543,440, filed on Feb. 9, 2004, by Kyle Spring, entitled, "Low Temperature Process and Structures For Polycide Power MOSFET with Ultra Shallow Source," the contents of which are herein incorporated by reference.

This application is also related to U.S. patent application Ser. No. 10/981,114, filed Nov. 4, 2004, by Kyle Spring, Jianjun Cao, Paul Harvey, Dave Kent, Robert Montgomery, and Hugo Burke, entitled "Trench Power MOSFET with Reduced Gate Resistance," the contents of which are herein incorporated by reference.

BACKGROUND OF THE INVENTION

1. Field of the Invention

The present invention relates generally to MOSFET devices, and more specifically, to trench-type MOSFET devices with ultra-shallow source regions and low temperature process flows.

2. Description of Related Art

Trench type power semiconductor devices such as power MOSFETs are well known. Referring to FIG. 1, there is illustrated an example typical power MOSFET 10, which includes a plurality of trenches 12 formed in semiconductor body 14. Semiconductor body 14 is usually a silicon die that includes an epitaxially grown silicon layer (epitaxial silicon layer) 16 of one conductivity (e.g. N-type) formed over a silicon substrate 18 of the same conductivity, but of higher concentration of impurities. A channel region 20 is formed in epitaxial silicon layer 16 and extends from the top surface of the semiconductor body to a first depth. Channel region 20 has a conductivity opposite to that of epitaxial layer 16 (e.g. P-type). Formed within channel region 20 are source regions 22, which have the same conductivity (e.g. N-type) as epitaxial silicon layer 16.

As is well known, trenches 12 extend through channel region 20 to epitaxial silicon layer 16. Lining the sidewalls and bottom surfaces of these trenches are gate insulation layer 24, which may be formed with silicon dioxide, for example. Within each trench 12 is gate electrode 26, which is typically composed of conductive polysilicon.

Example MOSFET 10 further includes a source electrode 28, which is electrically connected to source regions 22, and a high conductivity contact region 30, which is also formed in channel region 20. High conductivity contact region 30 is highly doped with dopants of the same conductivity as channel region 20 (e.g. P-type) in order to reduce the contact resistance between source contact 28 and channel region 20. Example MOSFET 10 further includes a drain electrode 32, which is in electrical contact with silicon substrate 18.

As is know, it is generally desirable for source regions 22 to extend deep enough into the semiconductor body so that they vertically overlap gate electrodes 26 (as illustrated by region 30 in FIG. 1). In this fashion, the gate electrodes fully overlap channel region 20 and allow for the formation of an accumulation region through the channel region so that current will flow between source electrode 28 and drain electrode 32. As is also known, source regions 22 are often formed, for example, by implanting dopants into the semiconductor body and then applying sufficient temperature for a sufficient time to diffuse the dopants to the desired depth. As illustrated in FIG. 1, gate electrodes 26 are often recessed within trenches 12 below the top surface of the semiconductor body, as illustrated by distance 32. As such, when forming source regions 22, sufficient temperatures and process times are needed to vertically diffuse the dopants at least through distances 32 and 30 so that there is overlap with the gate electrodes. However, for several reasons it is generally desirable to reduce the vertical depth of the source regions and as such, to minimize the amount of vertical diffusion needed to form these regions.

For example, larger vertical diffusions require higher diffusion temperatures and/or process times. However, increased temperatures and process times will generally affect fabrication costs and/or affect device performance. For example, high temperature process steps can adversely affect previously performed low temperature steps. As such, the high temperature steps must be performed before the low temperature steps, if possible. Alternatively, for example, the high temperature steps must be performed at reduced temperatures but at the cost of increased process times.

Another problem with larger vertical diffusions for source regions is that dopants do not only move vertically, but also laterally during diffusion. Hence, creating source regions with larger vertical depths also results in source regions with greater lateral length across the surface of the semiconductor device. However, this lateral diffusion is generally undesirable because it means the distance between trenches has to be increased. Increasing the distance between adjacent trenches, however, increases cell size. As is known, it is generally desirable to reduce the distance between trenches so that the number of trenches for a given die area can be increased, thereby reducing cell size and increasing the current the device can handle.

A further problem with larger vertical diffusions for source regions is that as the vertical depth of the source regions increases, the vertical depth of channel region 20 into epitaxial silicon layer 16 must also increase. However, an increased channel region depth also means that the length/depth of trenches 12 needs to increase so that the trenches extend into epitaxial silicon layer 16. In turn, increased trench depth means that the gate electrode length must also increase. However, as is known, it is generally desirable to reduce the gate electrode length in order to reduce gate charge ($Q_g$) and thereby improve the efficiency of the device.

SUMMARY OF THE INVENTION

Accordingly, it would be desirable to produce a trench type power semiconductor device that has source regions with reduced vertical depth, thereby overcoming the above and other disadvantages of the prior art. In accordance with the present invention, a trench type power MOSFET has "proud" gate electrodes that extend out of the trenches and above the surface of the semiconductor body. These proud gate electrodes enable making ultra-shallow source regions with nano-scale dimensions within the semiconductor body using a lower temperature source drive. Specifically, because the gate electrodes extend above the surface of the semiconductor body, there is no longer a need to diffuse the source regions to a depth that ensures vertical overlap to the gates and as such, the gate electrodes can be made ultra-shallow. In particular, the source regions of the present invention have vertical depths that are approximately equal to or less than the thickness of the gate oxide that lines the trenches of the device.

In addition and as indicated above, the source regions can be formed at low process temperatures, for example, less than 900° C. Alternatively, the annealing methods may include RTP (rapid thermal processing) and hence, the duration would be short (less than 1 minute).

The ultra-shallow source regions of the present invention have several advantages. For example, the reduced temperatures that can be used to form the source regions allows for an improved fabrication process where all process steps following the formation of gate electrodes within the trenches of the MOSFET device can be preformed at temperatures below 900° C. In addition, the formation of ultra-shallow source regions also results in source regions with less lateral diffusion. By reducing the lateral diffusion of the source regions, the distance between trenches can be reduced, thereby increasing the cell density of the device and the current the device can handle. Furthermore, because of the ultra-shallow source regions, the vertical depth of the channel region of the device can be reduced, thereby reducing the length of the trenches and reducing the length of the gate electrodes. The reduced gate electrode lengths decreases gate charge ($Q_g$) and improves the efficiency of the device.

In accordance with another aspect of the invention, the power MOSFET may optionally include silicide/salicide contacts on the gate electrodes, thereby reducing the resistive value ($R_g$) of the electrodes. In accordance with a further aspect of the invention, the power MOSFET includes high conductivity contact regions adjacent to the source regions and may optionally include silicide/salicide contacts that short the source regions to the high conductivity contact regions. These silicide/salicide contacts both reduce the contact resistance between the source regions and the source electrode of the device, thereby reducing the device's on-state resistance ($R_{DS(on)}$), and also improves the device's avalanche performance.

In an example process according to an embodiment of the present invention, a hard mask is used to form the trenches in the semiconductor body. This mask is then left in place and the gate electrodes are formed to reach the free surface of the hard mask. The gate electrodes are then optionally silicided or salicided. The hard mask is then removed producing the proud gate electrodes. Thereafter, a source implant region is formed in the semiconductor body and then partially covered, in areas adjacent to the trenches, by insulation caps formed over the gate electrodes. Next, the exposed areas of the source implant region are removed and dopants for a high conductivity region are implanted into the semiconductor body. Thereafter, a low temperature diffusion drive is carried out to form ultra-shallow source regions and high conductivity contact regions. Optionally, exposed surfaces of the source regions and high conductivity contact regions are then silicided or salicided. Again, in accordance with the present invention, all process steps after the formation of the gate electrodes can occur at temperatures less than 900° C.

DETAILED DESCRIPTION OF THE PREFERRED EMBODIMENTS

Figure 1:
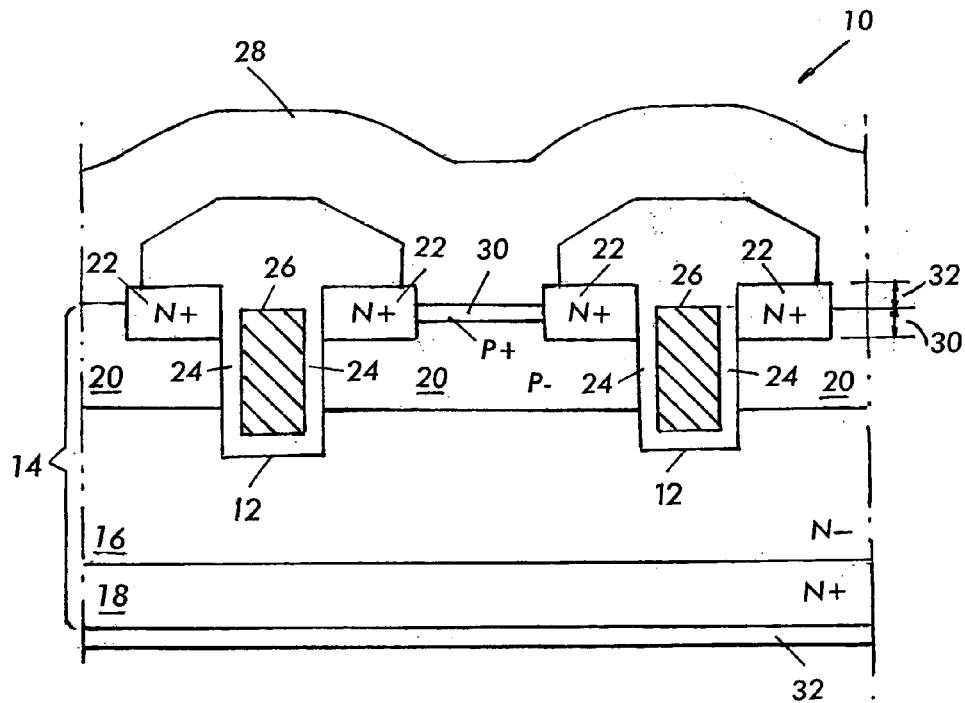
FIG. 1 shows a cross-sectional view of a trench type power MOSFET according to the prior art.
Figure 2:
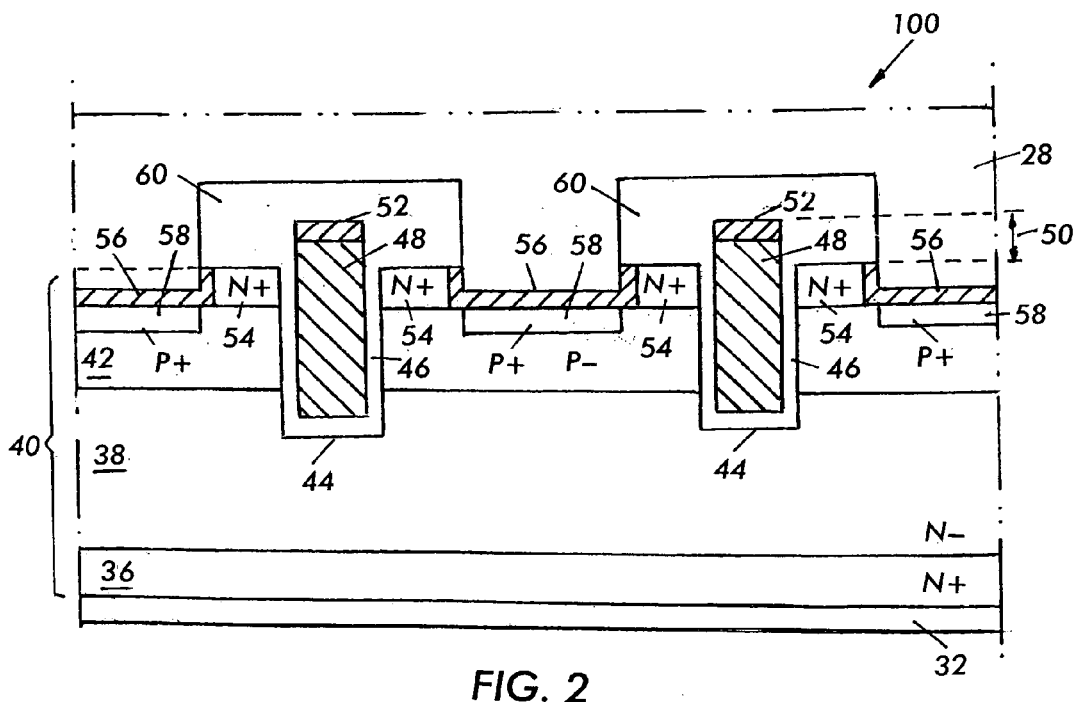
FIG. 2 shows a cross-sectional view of an example trench type power MOSFET according to an embodiment of the present invention.

Referring to FIG. 2, a section of an example power MOSFET 100 according to an embodiment of the present invention is illustrated. MOSFET 100 comprises a semiconductor body 40, which includes silicon substrate 36 and epitaxial silicon layer 38. Silicon substrate 36 and epitaxial silicon layer 38 have the same conductivity (e.g., N-type), with epitaxial silicon layer 38 including a lower concentration of dopants as compared to substrate 36. Semiconductor body 40 also includes channel region 42, which has conductivity opposite to that of epitaxial silicon layer 38 (e.g. P-type).

Formed within semiconductor body 40 are a plurality of trenches 44. Each of these trenches is lined with a gate insulation layer 46, formed with silicon dioxide, for example. Within each trench 46 are gate electrodes 48, composed of conductive polysilicon, for example. Significantly and as further discussed below, gate electrodes 48 are "proud", that is, the gate electrodes extend out of trenches 44 and above the top surface of the semiconductor body, as shown by distance 50. Preferably, although not required, the top ends of gate electrodes 48 include silicide/salicide contacts 52, as illustrated in FIG. 2. These contacts are preferably formed from titanium, but cobalt or nickel can also be used, for example.

Formed within channel region 42, at the upper edges of trenches 44, are source regions 54, which have the same conductivity (e.g. N-type) as epitaxial silicon layer 38. As further discussed below and in accordance with the present invention, these source regions are ultra-shallow. Also formed within channel region 42 are high conductivity contact regions 58, which have the same conductivity (e.g. P-type) as channel region 42. Preferably, although not required, MOSFET 100 also includes silicide/salicide contacts 56, as illustrated in FIG. 2. Again, these contacts are preferably formed from titanium, but cobalt or nickel can be used, for example. As seen, these contacts short the edges of source regions 54 to the surface of high conductivity contact regions 58.

Covering gate electrodes 22 and at least a portion of the top surface of source regions 54 are oxide insulation caps 60, composed from TEOS or the like for example. Finally, MOSFET 100 includes source electrode 28, which is electrically connected to source regions 54, and drain electrode 32, which is in electrical contact with silicon substrate 36.

As indicated, gate electrodes 48 extend above the top surface of the semiconductor body by distance 50. Significantly and in accordance with the present invention, the extended height of the gate electrodes enables making ultra-shallow source regions 54 using a lower temperature source drive. More specifically, because the gate electrodes extend above the surface of the semiconductor body, there is no longer a need to diffuse the source regions to a depth that ensures vertical overlap to the gates. Accordingly, the source regions of the present invention have vertical depths with nano-scale dimensions.

More specifically, source regions 54 of the present invention have vertical depths that are less than the thickness of gate oxide 46. However, the source regions may need to be deep enough to overcome any variation in the gate oxide thickness that may occur in the near surface region that is associated with the hard mask removal process (as described below, a hard mask layer can be used to form the trenches/proud gate electrodes). Accordingly, the depth of the source regions may need to be approximately the thickness of the gate oxide. This should lend itself to better threshold voltage control and uniformity. In general, the depth of the source regions will depend on the desired gate voltage withstand rating. For example, for 12 Vgs gates, the source regions have depths of approximately 300A or less, as compared to prior source regions that have depths of approximately 1500A.

As indicated, the ultra-shallow source regions 54 can be formed using a low temperature source drive at, for example, temperatures less than 900° C., such as 850° C. As an alternative, the annealing methods may include RTP (rapid thermal processing) and hence, the duration would be short (less than 1 minute). Spike anneals are currently standard practice in the industry that allow for higher temperatures (greater than 900° C.) for very short times (a few seconds at the peak of the spike). This allows for more complete activation of the implant without significant diffusion depths coinciding.

Advantageously, the ultra-shallow source regions 54 of the present invention have several benefits. For example, the reduced temperatures that can be used to form the source regions allows for an improved fabrication process where all process steps following the formation polysilicon gates 48 are preformed at temperatures below 900° C. This is advantageous, for example, because as indicated, MOSFET 100 preferably includes silicide/salicide contacts 52 at the tops of gates 48. As is known, once these contacts are in place, the process temperatures cannot exceed 900° C. without damaging the contacts. As discussed below, these silicide/salicide contacts are formed, for example, prior to the formation of source regions 54. As such, the low temperature source drive process of the present invention that can be used to form the source regions is compatible with the silicide/salicide gate process.

Another advantage of ultra-shallow source regions 54 is that because the regions are shallow, the lateral diffusion of the regions is also reduced. As indicated, by reducing the lateral diffusion of the source regions, the distance between trenches 44 can be reduced, thereby increasing the cell density of the device while also increasing the current the device can handle.

A further advantage of the ultra-shallow source regions is that the vertical depth of channel region 42 can be reduced in MOSFET 100. As a result, the length of trenches 44 in MOSFET 100 can also be reduced, which in turn means the length of gate electrodes 48 can be reduced. Again, reduced length of the gate electrodes decreases gate charge ($Q_g$) and improves the efficiency of the device.

MOSFET 100 of the present invention also has several additional advantages. First, by including silicide/salicide contacts 52 over the tops of gate electrodes 48, the local resistive value ($R_g$) of the electrodes is reduced. In addition, by including silicide/salicide contacts 56, the contact resistance between source electrode 28 and source regions 54 is reduced, thereby reducing the on-state resistance ($R_{DS(on)}$) of the device. Furthermore, as indicated above, silicide/salicide contacts 56 short source regions 54 to high conductivity contact regions 58, which improves the avalanche performance of the device (regions 58 act like a shunt around the source regions).

Reference will now be made to example process for fabricating MOSFET 100 in accordance with an embodiment of the present invention. In particular, the above referenced U.S. patent application Ser. No. 10/981,114, entitled "Trench Power MOSFET with Reduced Gate Resistance," teaches a MOSFET fabrication process for producing proud gate electrodes with silicide/salicide contacts. In particular, that fabrication process uses a hard mask layer to form the trenches in the semiconductor body. This mask layer is then left in place and the gate electrodes are formed to reach the free surface of the hard mask. The gate electrodes are then optionally silicided or salicided. The hard mask is then removed producing the proud gate electrodes.

Figure 3:
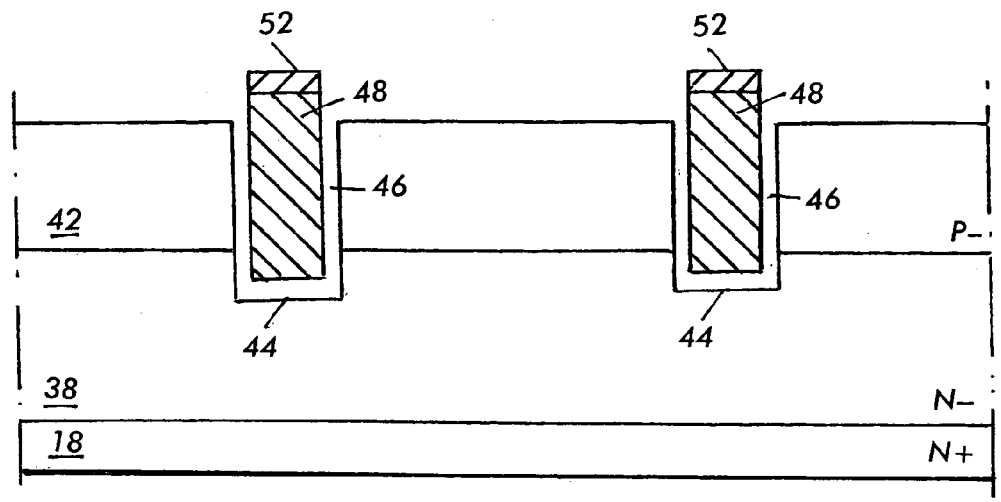
FIGS. 3–6 graphically illustrate an example process for fabricating the example trench type power MOSFET of FIG. 2.

An intermediate structure resulting from that process is illustrated in FIG. 3, which illustrates gate electrodes 48 with silicide/salicide contacts 52 extending above the top surface of channel region 42 (i.e., proud gate electrodes). Notably and as indicated above, in accordance with the present invention, all process steps following a polysilicon etching step, which ultimately resulted in the structure of FIG. 3, through the process steps described below, can be performed at low temperatures (i.e., less than 900° C.).

Figure 4:
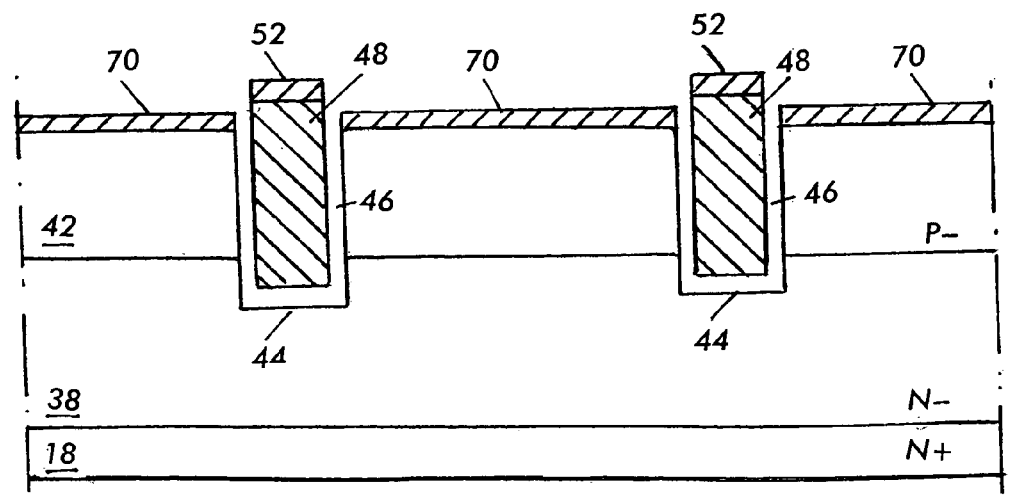
Figure 5:
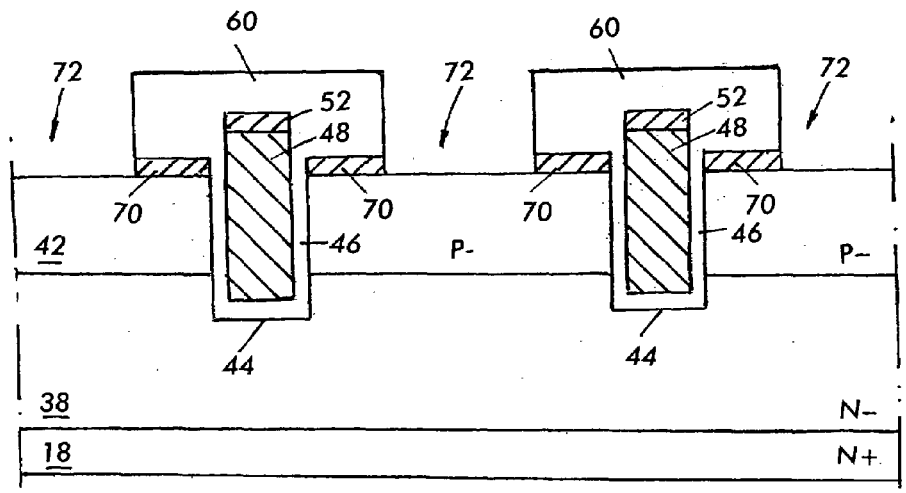

Beginning with the structure of FIG. 3 and referring now to FIG. 4, a source implant is next carried out to form source implant regions 70 in channel region 42 between trenches 44. Next, an oxide layer composed from TEOS, for example, is formed over the structure shown in FIG. 4, and with appropriate masking and etching, portions of the oxide layer are removed leaving insulation caps 60 over gate electrodes 48 and portions of source implant regions 70. The resulting structure is shown in FIG. 5. Note that as shown in FIG. 5, this etching step also removes portions of source implant regions 70, thereby exposing portions of channel region 42 (as indicated by arrows 72 in FIG. 5). Note also that because the present invention uses very shallow source regions, source resistance will increase. Hence, the lateral dimensions of the remaining source implant regions 70 (or in other words, the lateral dimension of caps 60) needs to be as short as possible (notably, this again supports higher cell density).

Figure 6:
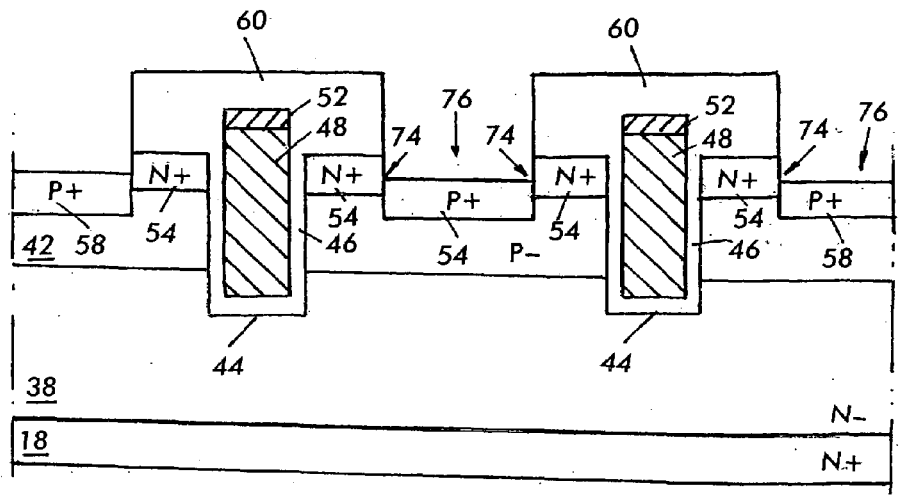

Next, dopants of the same conductivity as channel region 42 are implanted in channel region 42 in the areas designated by arrow 72. A diffusion drive at under 900° C. (e.g., 850° C.) is then performed forming ultra shallow source regions 54 and high conductivity contact regions 58, as illustrated in FIG. 6. Again, as seen, the low temperature source drive process of the present invention is compatible with the silicide/salicide 52 gate process.

Next, the exposed edges of source regions 54 (as designated by arrows 74 in FIG. 6) and the exposed surface of high conductivity contact regions 58 (as designated by arrows 76 in FIG. 6) are silicided or salicided forming silicide/salicide contacts 56 (as illustrated in FIG. 2). For example, a layer of metal, preferably titanium, however other metals such as cobalt or nickel can be used, is deposited over the surface of the structure of FIG. 6, and annealed. The metal reacts with the silicon at the edges of source regions 54 and with the silicon on the surface of high conductivity contact regions 58 and silicides portions of the same. Thereafter, the unreacted portion of the siliciding metal is removed.

Finally, a front metal and back metal are applied using known methods to obtain source contact 28 and drain contact 32. The resulting MOSFET structure is illustrated in FIG. 2.

Note that the invention is shown for an N-type trench MOSFET. Nonetheless, one skilled in the art will realize that the invention also applies to P-type trench MOSFETS.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A power semiconductor device, comprising:
    a semiconductor body of a first conductivity type;
    a plurality of trenches along a surface of said semiconductor body and extending to a first depth of said semiconductor body;
    a gate oxide layer lining surfaces of each of said plurality of trenches;
    a gate electrode within each of said plurality of trenches, each gate electrode including a free end extending above the surface of said semiconductor body; and
    a plurality of ultra-shallow source regions of said first conductivity type within said semiconductor body and extending to a second depth of said semiconductor body, wherein said second depth is approximately equal to or less than a thickness of said gate oxide layer.

2. The power semiconductor device of claim 1, wherein said device has a gate voltage withstand rating of 12V and said second depth is approximately equal to or less than 300A.

3. The power semiconductor device of claim 1, further comprising:
    a channel region of a second conductivity type in said semiconductor body such that said channel region extends from the surface of said semiconductor body to a third depth of said semiconductor body, said third depth being less than said first depth.

4. The power semiconductor device of claim 1, further comprising a silicide or salicide contact at the free end of each gate electrode.

5. The power semiconductor device of claim 1, wherein each of said plurality of ultra-shallow source regions extends from an edge of a trench to a length along the surface of said semiconductor body; and
    wherein said length of each source region is configured to reduce a distance between adjacent trenches, and wherein said second depth of each source region is configured to reduce said first depth of said plurality of trenches and to thereby reduce a gate charge of said gates.

6. The power semiconductor device of claim 1, further comprising a plurality of contact regions of a second conductivity type within said semiconductor body, each of said plurality of contact regions being adjacent to source regions.

7. The power semiconductor device of claim 6, further comprising a plurality of silicide or salicide contacts each of which shorts one of said plurality of contact regions to its adjacent source regions.

8. The power semiconductor device of claim 7, further comprising a silicide or salicide contact at the free end of each gate electrode.

* * * * *